(12) United States Patent
Jung et al.

(10) Patent No.: US 8,154,903 B2
(45) Date of Patent: Apr. 10, 2012

(54) SPLIT PATH SENSING CIRCUIT

(75) Inventors: Seong-Ook Jung, Seoul (KR); Jisu Kim, Seoul (KR); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 359 days.

(21) Appl. No.: 12/486,089

(22) Filed: Jun. 17, 2009

(65) Prior Publication Data

US 2010/0321976 A1 Dec. 23, 2010

(51) Int. Cl.
*G11C 11/00* (2006.01)

(52) U.S. Cl. ........ 365/148; 365/158; 365/205; 365/206; 365/207

(58) Field of Classification Search .................. 365/148, 365/158, 205, 206, 207
See application file for complete search history.

(56) References Cited

U.S. PATENT DOCUMENTS

| | | | |
|---|---|---|---|
| 5,528,543 A | 6/1996 | Stiegler | |
| 7,161,861 B2 * | 1/2007 | Gogl et al. | 365/207 |
| 7,251,178 B2 * | 7/2007 | Gogl et al. | 365/209 |
| 7,545,669 B2 * | 6/2009 | Liu et al. | 365/148 |
| 7,813,166 B2 * | 10/2010 | Jung et al. | 365/158 |
| 2004/0136256 A1 | 7/2004 | Dadashev | |

FOREIGN PATENT DOCUMENTS

EP 1562201 8/2005

OTHER PUBLICATIONS

Gogl.D., et al., "A 16-Mb MRAM featuring bootstrapped write drivers", IEEE JSSC, Apr. 2005, pp. 902-908.
Tsuji. T., et al., "A 1.2V 1Mbit embedded MRAM core with folding bit-ling array architecture", IEEE Symposium on VLSI circuit, Jun. 2004, pp. 450-453.
J. Nahas, et al., "A 4Mb 0.18 micro meter IT1MTJ "Toggle" MRAM Memory", IEEE International Solid-State Circuits Conference, Feb. 2004, pp. 1-3.
International Search Report—PCT/US2010/039075, International Search Authority—European Patent Office Sep. 24, 2010.
Written Opinion—PCT/US2010/039075, International Search Authority—European Patent Office Sep. 24, 2010.

* cited by examiner

*Primary Examiner* — Pho M Luu
(74) *Attorney, Agent, or Firm* — Sam Talpalatsky; Nicholas J. Pauley; Jonathan T. Velasco

(57) ABSTRACT

A sensing circuit is disclosed. The sensing circuit includes a first path including a first resistive memory device and a second path including a reference resistive memory device. The first path is coupled to a first split path including a first load transistor and to a second split path including a second load transistor. The second path is coupled to a third split path including a third load transistor and to a fourth split path including a fourth load transistor.

42 Claims, 7 Drawing Sheets

SPLIT PATH SENSING CIRCUIT

I. FIELD

The present disclosure is generally related to a split path sensing circuit including a split path sense amplifier and a resistance based memory circuit.

II. DESCRIPTION OF RELATED ART

Advances in technology have resulted in smaller and more powerful personal computing devices. For example, there currently exist a variety of portable computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. However, power consumption of such portable computing devices can quickly deplete a battery and diminish a user's experience.

Reducing power consumption has led to smaller circuitry feature sizes and operating voltages within such portable devices. Reduction of feature sizes and operating voltages, while reducing power consumption, also increases sensitivity to noise and to manufacturing process variations. Such increased sensitivity to noise and process variations may be difficult to overcome when designing memory devices that use sense amplifiers.

III. SUMMARY

A split path sense amplifier for a resistance based memory is disclosed. The split path sense amplifier increases sensing margin by shifting a reference voltage based on a state of a data cell with a reduced sensitivity to process variation and transistor mismatch. One or more transistor characteristics may be adjusted to modify at least one of a first read margin and a second read margin of the sense amplifier.

In a particular embodiment, a sensing circuit is disclosed. The sensing circuit includes a first path including a first resistive memory device and a second path including a reference resistive memory device. The first path is coupled to a first split path including a first load transistor and to a second split path including a second load transistor. The second path is coupled to a third split path including a third load transistor and to a fourth split path including a fourth load transistor.

In another particular embodiment, an apparatus is disclosed that includes a memory. The memory includes a first memory cell including a first resistive memory device and a second memory cell including a second resistive memory device. A first bit line is coupled to the first memory cell, and a second bit line is coupled to the second memory cell. The first bit line is coupled to a first set of split paths including load transistors. The second bit line is coupled to a second set of split paths. During a read operation, the first bit line has a first voltage value when the first resistive memory device is in a first logic state and a second voltage value when the first resistive memory device is in a second logic state.

In another particular embodiment, a method of configuring a sense amplifier is disclosed. The method includes directing current through a first path including a first resistive memory device and directing current through a second path including a reference resistive memory device. The first path is coupled to a first split path and to a second split path. The first split path includes a first load transistor, and the second split path includes a second load transistor. The second path is coupled to a third split path and to a fourth split path. The third split path includes a third load transistor, and the fourth split path includes a fourth load transistor.

One particular advantage provided by at least one of the disclosed embodiments is that operation of a resistance based memory may be improved by increasing a sensing margin of the resistance based memory as compared to conventional sensing circuits. The increased sensing margin may improve a tolerance of the resistance based memory to noise or process variation during read operations. Improved sensing margin may also lead to improved memory device yield.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
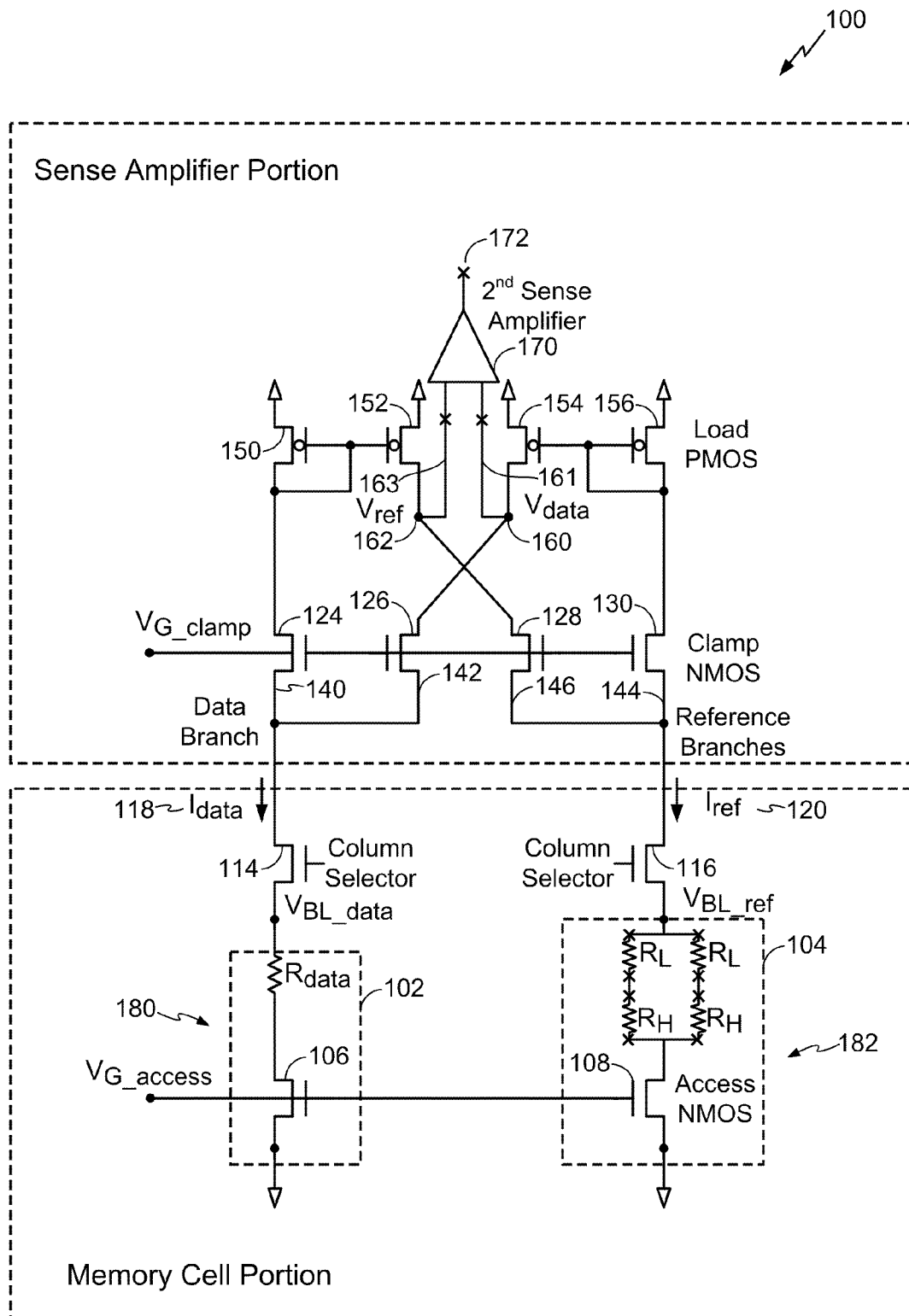
FIG. 1 is a circuit diagram of a particular illustrative embodiment of a resistance based memory including a split path sense amplifier.

Referring to FIG. 1, a particular illustrative embodiment of a sensing circuit with a split path sense amplifier is depicted and generally designated 100. The sensing circuit 100 includes a first path 180 that includes a first resistive memory device 102 and a second path 182 that includes a second reference resistive memory device 104. In a particular embodiment, the first resistive memory device 102 is a magnetic tunnel junction (MTJ) device. Similarly, the reference resistive memory device 104 may be implemented, in a particular embodiment, as an MTJ device or a combination of MTJ devices storing predetermined values. In the particular embodiment shown in FIG. 1, the first path 180 includes a first column selector transistor 114 and a first access transistor 106. Similarly, the second path 182 includes a second column selector transistor 116 and a second access transistor 108. The first and second access transistors 106, 108 may be n-channel metal-oxide-semiconductor (NMOS) type transistors. The first path 180 may be a data path that carries a read current that represents either a logic 0 or a logic 1 value and the second path 182 is a reference path.

In the particular embodiment shown in FIG. 1, the first path 180 is coupled to a first split path 140 and to a second split path 142. The first split path 140 includes a first clamping transistor 124 and a first load transistor 150. The second split path 142 includes a second clamping transistor 126 and a second load transistor 154. The second path 182 is coupled to a third split path 144 and to a fourth split path 146. The third split path 144 includes a third clamping transistor 130 and a third load transistor 156. The fourth split path 146 includes a fourth clamping transistor 128 and a fourth load transistor 152.

As shown in FIG. 1, the first load transistor 150 is coupled to the fourth load transistor 152 via a first common gate bias. In addition, the third load transistor 156 is coupled to the second load transistor 154 via a second common gate bias. The second load transistor 154 is coupled to a data node (Vdata) 160 that in turn is coupled to the second clamping transistor 126. The fourth load transistor 152 is coupled to a reference node (Vref) 162 that in turn is coupled to the fourth clamping transistor 128. An output 161 of the second load transistor 154 is provided as an input to a second sense amplifier 170. Similarly, an output 163 of the fourth load transistor 152 is provided as an input to the second sense amplifier 170. The second sense amplifier 170 receives the outputs 161, 163 from the load transistors 154, 152, respectively, as shown. The second sense amplifier 170 compares the outputs 161, 163 and provides a resulting sense amplifier output 172. Thus, the second sense amplifier 170 is responsive to the second load transistor 154 and the fourth load transistor 152. In a particular embodiment, each of the load transistors 150, 152, 154, 156 are p-channel metal-oxide semiconductor (PMOS) type transistors.

During operation, the sensing circuit 100 operates in one of two primary states: a logic 1 state indicating a logic 1 value stored at the first resistive memory device 102 and a logic 0 state indicating a logic 0 value stored at the first resistive memory device 102. For example, when a current Idata 118 along the first path 180 is less than a current Iref 120 along the second path 182, the voltage at the data node (Vdata) 160 is greater than the voltage at the reference node (Vref) 162. In this situation, the second sense amplifier 170 provides a high value at its output 172 indicating the logic 1 state, or a logic high state. Alternatively, when the current Idata 118 along the first path 180 is high (i.e., greater than the current Iref 120 along the second path 182) the voltage at the data node (Vdata) 160 is lower than the voltage at the reference node (Vref) 162. Because the voltage at the data node (Vdata) 160 is lower than the voltage at reference node (Vref) 162, the logic state indicated at the output 172 of the second sense amplifier 170 is the logic 0 state, or a logic low state. Thus, the relative voltages between the data node (Vdata) 160 and the reference node (Vref) 162 as detected by the second sense amplifier 170 provide an indication of the sensed output of the sensing circuit 100.

It should be noted that the coupling of the first path 180 to the first split path 140 and to the second split path 142 provides for a split current value path through the second clamp transistor 126 that is coupled to the data node (Vdata) 160. The output of the second load transistor 154 generates the voltage at the reference node (Vdata) 160 that is provided to an input of the second sense amplifier 170. Similarly, the second path 182 is coupled to the third split path 144 and the fourth split path 146. The reference current Iref 120 influences the current over the third split path 144 and the fourth split path 146 that in turn are coupled to the clamp transistors 130, 128. The fourth clamp transistor 128 provides a split current to the reference node (Vref) 162 that is driven by an output of the fourth load transistor 152. Thus, a relative difference between the data node (Vdata) 160 and the reference node (Vref) 162 is increased, providing a greater sense margin to detect a logic 0 or a logic 1 condition with respect to the sense amplifier 170.

In a particular embodiment, a resistance value Rdata of the first resistive memory device 102 of the first path 180 and a resistance value of the second reference resistive memory device 104 of the second path 182 are determined by values of an underlying magnetic memory device. In particular, the value of Rdata of the first resistive memory device 102 is determined by a state of an MTJ device. In a first state, the MTJ device has a low resistance value and in a second state the MTJ device has a high resistance value. In contrast, the resistance of the second path 182, where the resistance of the second reference resistive memory device 104 is represented by a resistor cluster, provides a reference value. Thus, when the resistance value Rdata associated with the first resistive memory device 102 is at a low value (low resistance), the current Idata 118 that flows along the first path 180 has a high value relative to the current Iref 120 that flows along the second path 182. Because the current Idata 118 has a high value, the corresponding voltage at the data node (Vdata) 160 has a low value that corresponds to the low resistance value of Rdata. Thus, the relative voltages at the data node (Vdata) 160 and the reference node (Vref) 162 correspond to the state of the resistance based memory elements 102 and 104. In this manner, a change in resistance value derived from a change in magnetic moment within a resistance based memory cell may be detected by the sensing circuit 100.

In addition to enhanced current sense margin, the illustrative circuit design of the sensing circuit 100 also provides for a reduced number of transistors. For example, by use of the split data paths such as the first and second split paths 140, 142 and the third and fourth split paths 144, 146, a use of additional transistors to provide current mirror operations is eliminated. Thus, the sensing circuit 100 provides increased sense margins to detect data read operations of a resistance based memory without the extra costs involved with use of additional transistors due to current mirroring and the corresponding device mismatch in the mirroring circuits due to variation increase with reduced feature size. As a further example, if a conventional current mirror sense amplifier were used in the circuit 100, an additional four transistors would be required for the design. Thus, the circuit 100 enables additional sense margin with reduced costs and reduced number of transistors.

In addition, in a particular embodiment, the first resistive memory device 102 having the resistance value Rdata may be an element such as a magnetic tunnel junction (MTJ) element of a magnetoresistive random access memory (MRAM). Alternatively, the first resistive memory device 102 having resistance Rdata may be an MTJ element of a spin transfer torque magnetoresistive random access memory (STT-MRAM). Although MTJ devices for MRAM and STT-MRAM embodiments have been described, it should be understood that the sensing circuit 100 is usable with other types of resistance based memories.

Performing statistical analysis of a population of memory devices may enable a designer to address process variations (especially in a sense amplifier) that tend to increase with technology scaling. In a particular illustrative embodiment, a first read margin is a logic zero read margin and is used to detect a logic 0 condition and a second read margin is a logic one read margin and is used to detect a logic 1 condition. In a particular embodiment, a signal margin $\Delta V$ corresponds to a difference between a voltage at the data node (Vdata) 160 and a voltage at the reference node (Vref) 162 in a logic 1 state ($\Delta V_1$), or a difference between a voltage at the reference node (Vref) 162 and a voltage at the data node (Vdata) in a logic 0 state ($\Delta V_0$), whichever is smaller. By balancing a first read margin $\Delta V_0$ and a second read margin $\Delta V_1$ of a population, the signal margin $\Delta V$ may be improved. By improving signal margin $\Delta V$, memory device yield may be improved.

In a particular embodiment, a characteristic of the load transistors may be adjusted to modify either the first read margin $\Delta V_0$ or the second read margin $\Delta V_1$. For example, a characteristic of the second load transistor 154 and the third load transistor 156 may be adjusted to modify one or more of the first and second read margins $\Delta V_0$ and $\Delta V_1$. A particular characteristic of the second load transistor 154 and the third load transistor 156 that can be adjusted is a transistor width. Alternatively, or in addition, other characteristics of the load transistors may be adjusted based on a particular design. In a particular illustrative embodiment, a width of the second load transistor 154 may be greater than a width of the third load transistor 156. In this manner, the first read margin $\Delta V_0$ and the second read margin $\Delta V_1$ may be better balanced. For example, if the first read margin $\Delta V_0$ has a lower voltage difference than the second read margin $\Delta V_1$, by adjusting characteristics of the second and third load transistors 154, 156, the differences between the first and second read margins $\Delta V_0$ and $\Delta V_1$ may be adjusted and balanced accordingly. Thus, a greater overall signal margin $\Delta V$ may be obtained for the sensing circuit 100. In addition, while only a single sensing circuit 100 is shown, it should be understood that a plurality of sensing circuits may be found within an array of a memory device, and the entire memory device may be integrated in a semiconductor die for use in a semiconductor package device. In a particular embodiment, the sensing circuit 100 illustrated in FIG. 1 may be incorporated into a larger device such as a device selected from the group consisting of a set-top box device, a music player, a video player, an entertainment unit, a navigation device, a communications device, a personal digital assistant (PDA), a fixed location data unit, and a computer, into which the sensing circuit is integrated. Each of such devices would include a computer readable memory where the memory includes the sensing circuit 100 as illustrated in FIG. 1.

Figure 2:
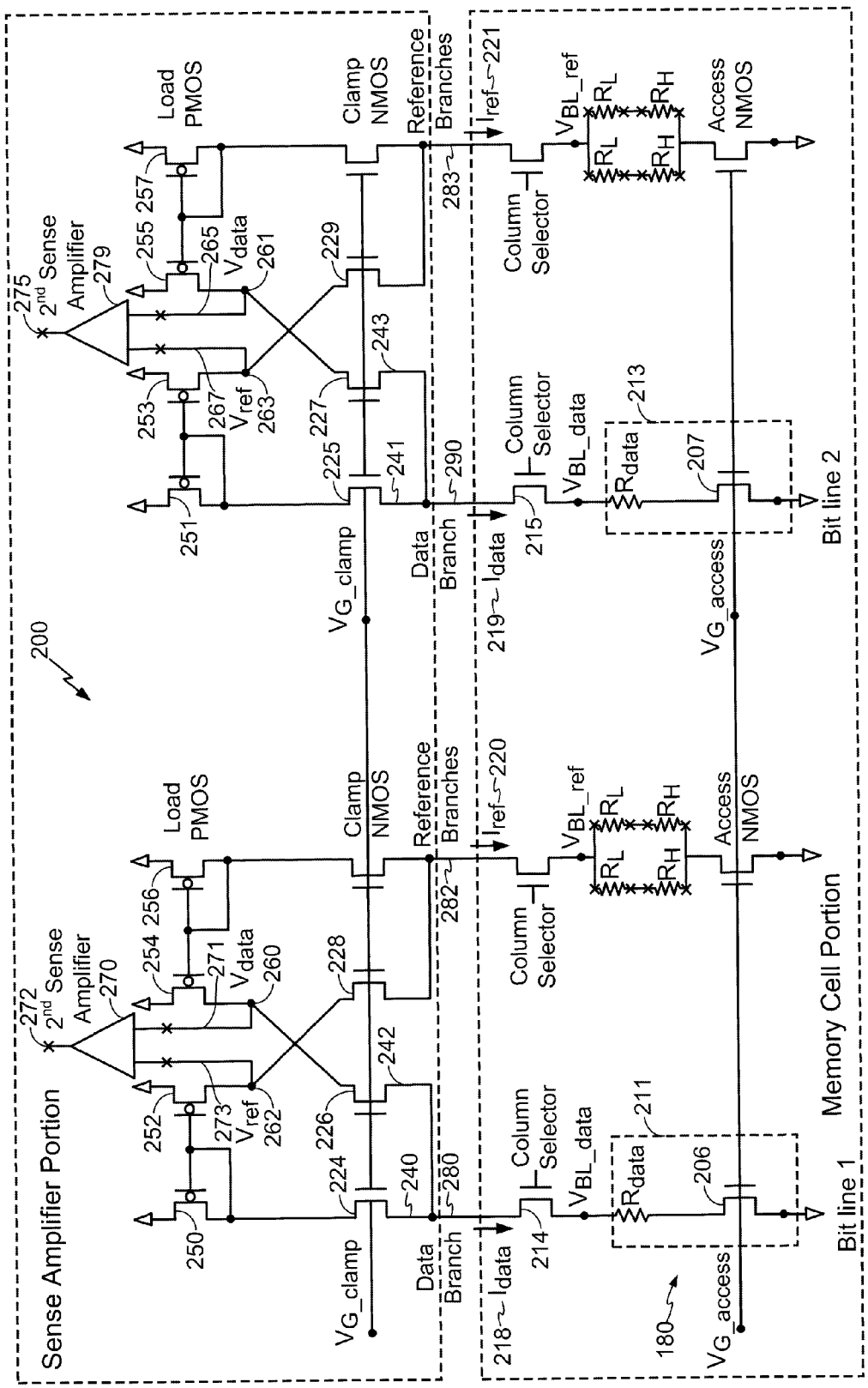
FIG. 2 is a circuit diagram of a particular illustrative embodiment of an apparatus including a memory having a resistance based memory cell and a split path sense amplifier.

Referring to FIG. 2, a particular illustrative embodiment of an apparatus that includes a memory having a resistance based memory cell and a split path sense amplifier is depicted and generally designated 200. For ease of explanation, the apparatus is illustrated including a sense amplifier portion and a memory cell portion, where commonly biased clamp transistors are shown as coupled and where commonly biased access transistors are shown as coupled. The memory includes a first representative memory cell 211 coupled to a second representative memory cell 213. While the memory 200 includes a plurality of memory cells, the first and second memory cells 211, 213 are shown for simplicity of explanation. Each of the memory cells, including the first memory cell 211 and the second memory cell 213, includes a resistive memory device, such as a magnetic tunnel junction (MTJ) device. Each MTJ device within the respective memory cells 211, 213, is represented by a resistor having a resistive state or value as illustrated in FIG. 2. The first memory cell 211 includes a first bit line 280 and the second memory cell 213 includes a second bit line 290. The first bit line 280 is coupled to the first memory cell 211. The first bit line 280 is also coupled to a first set of split paths, such as the illustrated split paths 240, 242. The first set of split paths 240, 242 are coupled to a plurality of load transistors as illustrated. For example, the first set of split paths 240, 242 are coupled to respective load transistors 250 and 254. The second bit line 290 is coupled to the second memory cell 213. The second bit line 290 is also coupled to a second set of split paths such as the illustrated split paths 241 and 243 as shown. The second set of split paths 241, 243 are coupled to respective load transistors 251 and 255.

During a memory read operation, the first bit line 280 has a first current value when the MTJ device within the memory cell 211 has a first logic state. The first bit line 280 has a second current value when the MTJ device within the memory cell 211 has a second logic state. For example, the first bit line 280 may have a first current value when the MTJ device is in a low resistance state and the bit line 280 may have a high current value when the MTJ device is in a high resistance state. In a particular embodiment, the first logic state is a logic zero state and the second logic state is a logic one state. In this manner, resistance changes of the MTJ device within the memory cell 211 may be detected by the sensing circuit within the memory 200 as illustrated in FIG. 2.

In a particular embodiment, the first memory cell 211 further includes a first column selector transistor 214 and a first access transistor 206. A first set of clamping transistors 224, 226 are coupled to the first set of split paths 240, 242. As shown in FIG. 2, the load transistor 250 is coupled to a load transistor 252 to have a common gate bias. In addition, a load transistor 256 is coupled to a load transistor 254 to have a common gate bias. The load transistor 254 is coupled to a data node (Vdata) 260 that in turn is coupled to the clamping transistor 226. The load transistor 252 is coupled to a reference node (Vref) 262 that in turn is coupled to a clamping transistor 228. An output 271 of the load transistor 254 is provided as an input to a second sense amplifier 270. Similarly, an output 273 of the load transistor 252 is provided as an input to the second sense amplifier 270. The second sense amplifier 270 receives the outputs 271, 273 from the load transistors 254, 252, respectively, as shown. The second sense amplifier 270 compares the outputs 271, 273 and provides a resulting sense amplifier output 272. Thus, the second sense amplifier 270 of the representative memory cell 211 is responsive to the load transistor 254 and the load transistor 252. In a particular embodiment, each of the load transistors 250, 252, 254, 256 are PMOS type transistors.

In a particular embodiment, the second memory cell 213 further includes a second column selector transistor 215 and a second access transistor 207. A second set of clamping transistors 225, 227 are coupled to the second set of split paths 241, 243. As shown in FIG. 2, the load transistor 251 is coupled to a load transistor 253 to have a common gate bias. In addition, a load transistor 257 is coupled to the load transistor 255 to have a common gate bias. The load transistor 255 is coupled to a reference node (Vdata) 261 that in turn is coupled to the clamping transistor 227. The load transistor 253 is coupled to a reference node (Vref) 263 that in turn is coupled to a clamping transistor 229. An output 265 of the load transistor 255 is provided as an input to a second sense amplifier 279. Similarly, an output 267 of the load transistor 253 is provided as an input to the second sense amplifier 279. The second sense amplifier 279 receives the outputs 265, 267 from the load transistors 255, 253, respectively, as shown. The second sense amplifier 279 compares the outputs 265, 267 and provides a resulting sense amplifier output 275. Thus, the second sense amplifier 279 of the representative memory cell 213 is responsive to the load transistor 255 and the load transistor 253. In a particular embodiment, each of the load transistors 251, 253, 255, 257 are PMOS type transistors.

During operation, the memory cell 211 operates in one of two states: a logic 1 state and a logic 0 state. Similarly, the memory cell 213 operates in one of two states: a logic 1 state and a logic 0 state. For example, when a current Idata 218 along the first bit line 280 is less than a current Iref 220 along a second path 282, the voltage at the data node (Vdata) 260 is greater than the voltage at reference node (Vref) 262. In this situation, the sense amplifier 270 provides a high value at its output 272 indicating the logic 1 state, or a logic high state. Alternatively, when the current Idata 218 along the first bit line 280 is high (i.e., great than the current Iref 220 sent over the second path 282) the voltage at the data node (Vdata) 260 is less than the voltage at the reference node (Vref) 262. Because the voltage at data node (Vdata) 260 is lower than the voltage at the reference node (Vref) 262, the logic state indicated at the output 272 of the sense amplifier 270 is the logic 0 state, or a logic low state. Thus, the relative voltages between the data node (Vdata) 260 and the reference node (Vref) 262 as detected by the second sense amplifier 270 provide an indication of the sensed output of the representative memory cell 211.

When a current Idata 219 along the second bit line 290 is less than a current Iref 221 along a third path 283, the voltage at the data node (Vdata) 261 is greater than the voltage at the reference node (Vref) 263 and the sense amplifier 279 provides a high value at its output 275 indicating the logic 1 state, or a logic high state. Alternatively, when the current Idata 219 along the second bit line 290 is high (i.e., greater than the current Iref 221 along the third path 283) the voltage at the data node (Vdata) 261 is less than the voltage at the reference node (Vref) 263. Because the voltage at the data node (Vdata) 261 is lower than the voltage at the reference node (Vref) 263, the logic state indicated at the output 275 of the second sense amplifier 279 is the logic 0 state, or a logic low state. Thus, the relative voltages between the data node (Vdata) 261 and the reference node (Vref) 263 as detected by the second sense amplifier 279 provide an indication of the sensed output of the memory cell 213.

In a particular embodiment, a characteristic of the load transistors may be adjusted to modify a voltage value at the reference nodes. For example, a characteristic of the load transistors 250, 252, 254, 256 of the memory cell 211 may be adjusted to modify voltages at the data node (Vdata) 260 and at the reference node (Vref) 262. A particular example of a characteristic of the load transistors 250, 252, 254, 256 is a transistor width. Alternatively, other characteristics of the load transistors may be adjusted based on a particular design. In addition, it should be understood that a plurality of memory cells would be found within an array of a memory device and the entire memory device may be integrated in a semiconductor die for use in a semiconductor package device.

Figure 3:
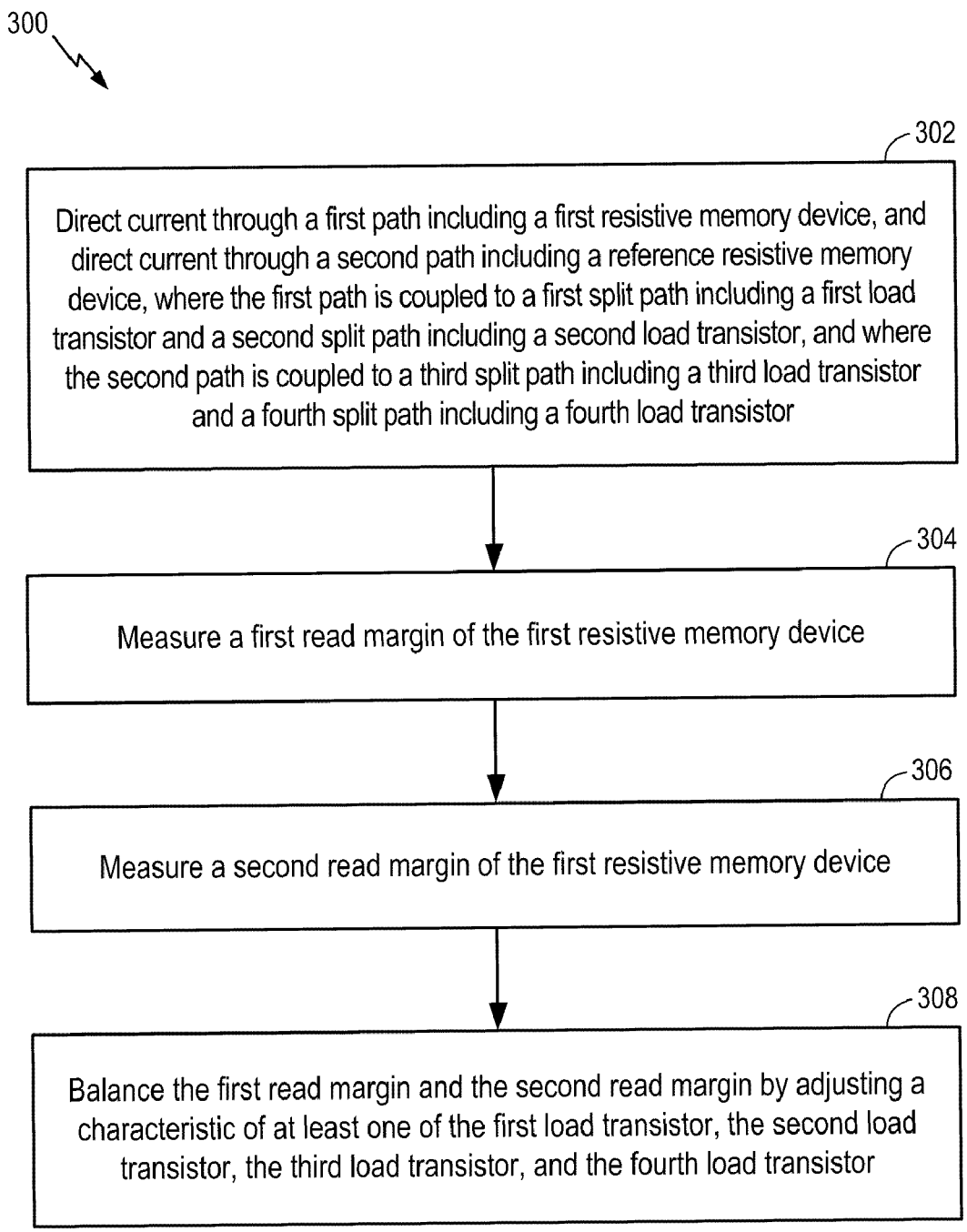
FIG. 3 is a flow diagram of a particular embodiment of a method of configuring a split path sense amplifier in a resistance based memory circuit.

Referring to FIG. 3, a flow diagram of a particular embodiment of a method of configuring a sense amplifier in a resistance based memory circuit is depicted and generally designated 300. In a particular embodiment, the method 300 includes directing current through a first path that includes a first resistive memory device and directing current through a second path that includes a reference resistive memory device, at 302. The first path is coupled to a first split path and to a second split path. The first split path includes a first load transistor and the second split path includes a second load transistor. The second path is coupled to a third split path and to a fourth split path. The third split path includes a third load transistor and the fourth split path includes a fourth load transistor.

As an example, a value of Rdata in FIG. 1 may be set and signals applied to perform a read operation at the sensing circuit 100. The first path may be the first data path 180 of FIG. 1 and the second path may be the reference path 182 of FIG. 1. The first resistive memory device may be the first resistive memory device 102 of FIG. 1, and the second resistive memory device may be reference resistive memory device 104 of FIG. 1.

The method 300 may further include measuring a first read margin of the first resistive memory device, at 304. The first read margin of the first resistive memory device may be a logic 0 read margin. The method may further include measuring a second read margin of the first resistance memory device, at 306. For example, the second read margin may be a logic 1 read margin.

The method 300 may also include balancing the first read margin and the second read margin by adjusting a characteristic of at least one of the first load transistor, the second load transistor, the third load transistor and the fourth load transistor, as shown at 308. For example, a characteristic, such as a transistor width, of the second load transistor 154 of FIG. 1 may be adjusted as compared to a corresponding characteristic such as the transistor width of the fourth load transistor 152 of FIG. 1. Alternatively, characteristics of the first load transistor 150 and the third load transistor 156 may be adjusted so that the first and second read margins may be balanced. In a particular embodiment, the first resistive memory device and the reference resistive memory device include a magnetic tunnel junction (MTJ) device.

For example, the method 300 may be performed by an engineer using a simulation tool to perform statistical analysis of a population of memory devices to improve sensing margin of the sense amplifier. In another example, the method 300 may be performed by a processor executing instructions stored at a computer readable tangible medium, where the instructions include instructions that are executable by the processor to direct current through a first path including a first resistive memory device and to direct current through a second path including a reference resistive memory device. The first path is coupled to a first split path and to a second split path and includes a first load transistor. The second split path includes a second load transistor. The second path is coupled to a third split path and to a fourth split path. The third split path includes a third load transistor and the fourth split path includes a fourth load transistor.

Thus, a particular embodiment of a method of configuring a sense amplifier and of reading data from a resistive memory device has been described. The method beneficially includes routing current through split paths to increase the sense margin of the sense amplifier. In addition, characteristics of certain elements within the sensing circuit may be adjusted to balance the logic 0 versus logic 1 read margins.

Figure 4:
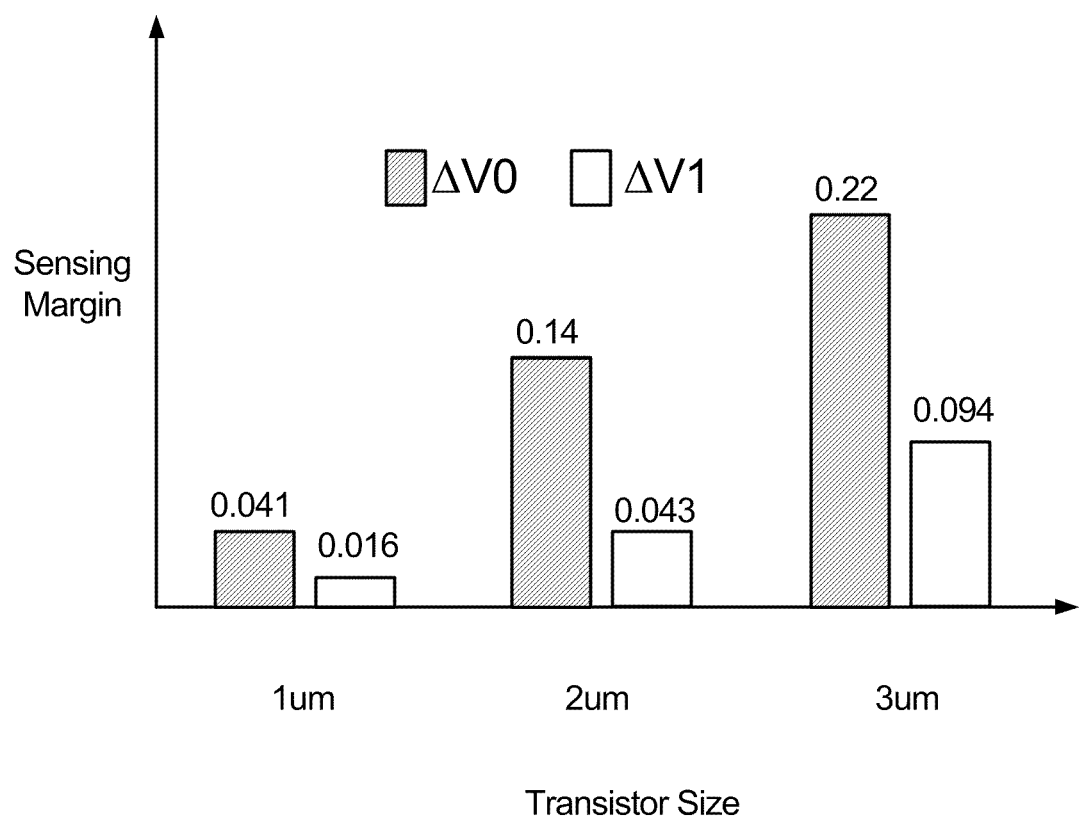
FIG. 4 is a graph of sensing margins versus transistor size where a particular embodiment of experimental results of sense margins for a first sense margin and a second sense margin are shown for various device sizes of elements within the sensing circuit depicted in FIG. 1.

Referring to FIG. 4, a graph of sensing margins versus transistor size is illustrated where a particular example of results of sense margins for a first sense margin ($\Delta V_0$) and second sense margin ($\Delta V_1$) are shown for various device sizes of elements within the sensing circuit 100. In FIG. 4, the sensing circuit 100 has unbalanced read margins as determined using a corner simulation. For example, at transistor widths of 1 micrometer at the first clamping transistor 124 and the first load transistor 150, $\Delta V_0=0.041V$ and $\Delta V_1=0.016V$. At transistor widths of 2 micrometers at the first clamping transistor 124 and the first load transistor 150, $\Delta V_0=0.14V$ and $\Delta V_1=0.043V$. At transistor widths of 3 micrometers at the first clamping transistor 124 and the first load transistor 150, $\Delta V_0=0.22V$ and $\Delta V_1=0.094V$.

Figure 5:
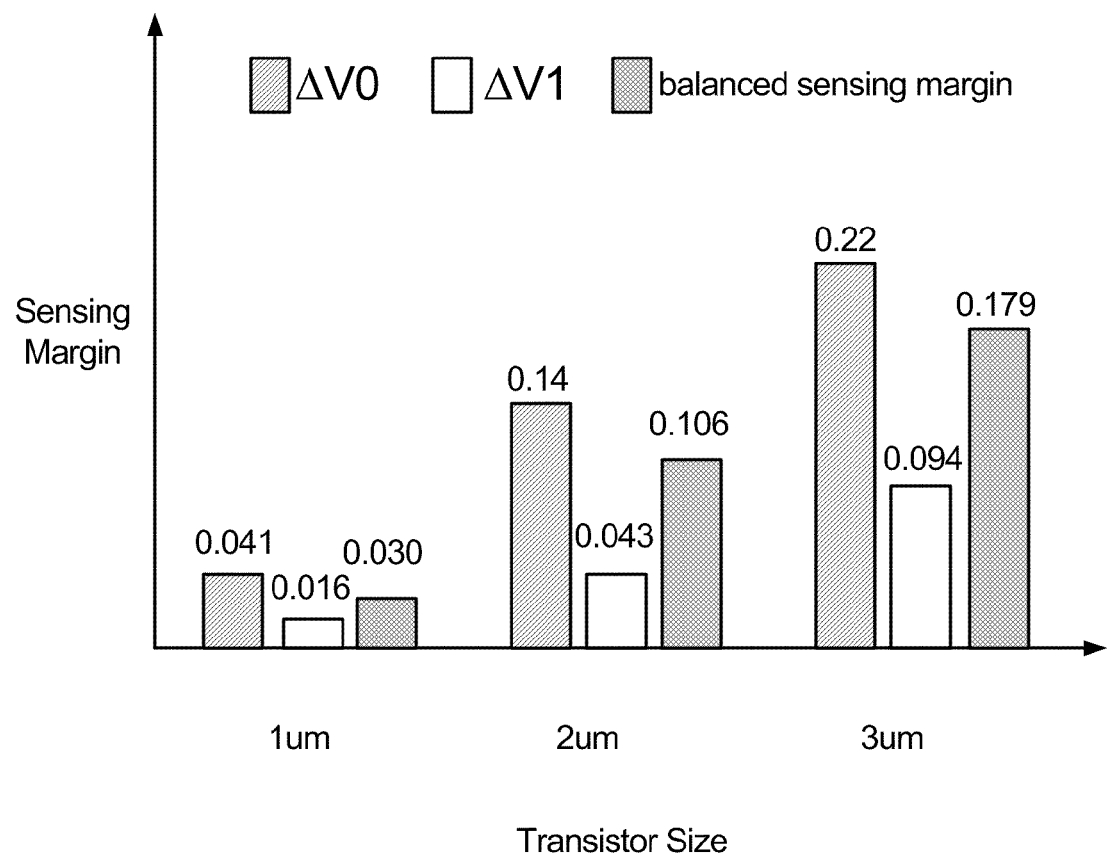
FIG. 5 is a graph of sensing margins versus transistor size where a particular embodiment of a sense circuit with a balanced sense margin due to adjustment of characteristics of one or more of the load transistors of the circuit depicted in FIG. 1 is illustrated.

Referring to FIG. 5, a graph of sensing margins versus transistor size is illustrated where a particular embodiment of a resulting balanced sense margin due to adjustment of characteristics of one or more of the load transistors of the circuit is illustrated. For example, at transistor widths of 1 micrometer at the third clamping transistor 130 and the third load transistor 156, the unbalanced $\Delta V_0=0.041V$, $\Delta V_1=0.016V$ shown in FIG. 4 are contrasted with a balanced sensing margin=0.030V. At transistor widths of 2 micrometers at the third clamping transistor 130 and the third load transistor 156, the unbalanced $\Delta V_0=0.14V$, $\Delta V_1=0.043V$ shown in FIG. 4 are contrasted with the balanced sensing margin=0.106V. At transistor widths of 3 micrometers at the third clamping transistor 130 and the third load transistor 156, the unbalanced $\Delta V_0=0.22V$, $\Delta V_1=0.094V$ shown in FIG. 4 are contrasted with the balanced sensing margin=0.179V. Thus, in FIG. 5, a balanced sense margin is higher than a lowest of the unbalanced first and second sense margins ($\Delta V_0$ and $\Delta V_1$), thereby providing a higher degree of read circuit utility of the sensing circuit 100. For example, while the first sense margin $\Delta V_0$ is 0.14 at transistor widths of 2 micrometers at the third clamping transistor 130 and the third load transistor 156, the second sense margin $\Delta V_1$ is only 0.043. In certain designs or applications, a sense margin less than 0.05 may be below a tolerance threshold. In contrast, the balanced sense margin at 2 micrometers of 0.106, which may be achieved by reducing the width of third load transistor 156 to 1.87 micrometer, would be above the design tolerance threshold and so the balanced sense margin circuit would comply with such tolerance specifications. The balanced sense margin indicates a tolerance of a resistance based memory to noise or to process variation in detecting a logic value stored at a resistance based memory element. By improving sense amplifier margin, memory device yield may be improved.

Figure 6:
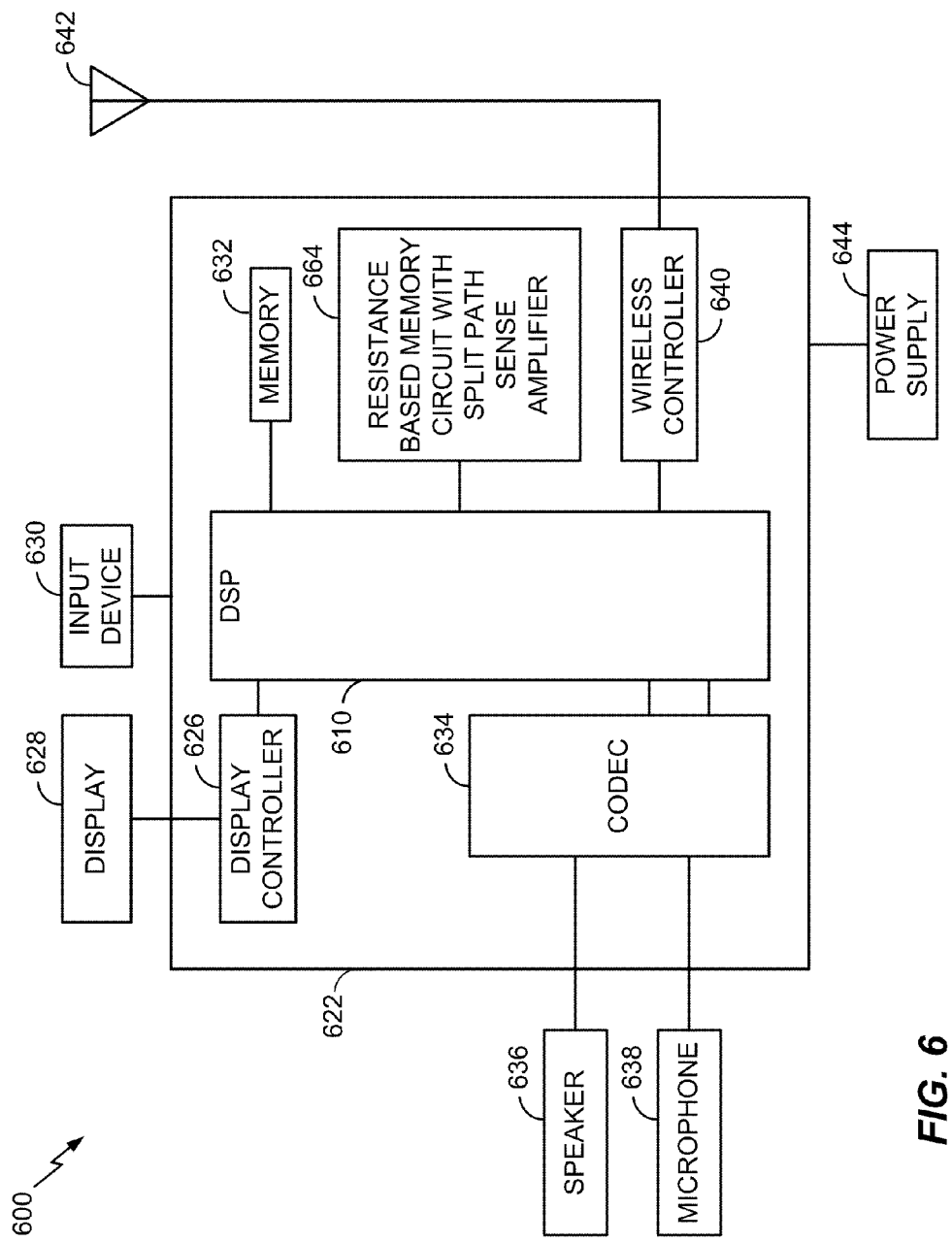
FIG. 6 is a block diagram of a particular illustrative embodiment of a wireless device including a resistance based memory circuit having a split path sense amplifier.

Referring to FIG. 6, a block diagram of a particular illustrative embodiment of an electronic device, such as a wireless phone, including a resistance based memory circuit including a split path sense amplifier, as described herein, is depicted and generally designated 600. The device 600 includes a processor, such as a digital signal processor (DSP) 610, coupled to a memory 632 and also coupled to a resistance based memory circuit including a split path sense amplifier 664. In an illustrative example, the resistance based memory circuit including a split path sense amplifier 664 includes the sensing circuit 100 depicted in FIG. 1, the apparatus 200 depicted in FIG. 2, or any combination thereof. In a particular embodiment, the resistance based memory circuit including a split path sense amplifier 664 includes a spin torque transfer magnetoresistive random access memory (STT-MRAM) memory device.

FIG. 6 also shows a display controller 626 that is coupled to the digital signal processor 610 and to a display 628. A coder/decoder (CODEC) 634 can also be coupled to the digital signal processor 610. A speaker 636 and a microphone 638 can be coupled to the CODEC 634.

FIG. 6 also indicates that a wireless controller 640 can be coupled to the digital signal processor 610 and to a wireless antenna 642. In a particular embodiment, the DSP 610, the display controller 626, the memory 632, the CODEC 634, the wireless controller 640, and the resistance based memory circuit including a split path sense amplifier 664 are included in a system-in-package or system-on-chip 622. In a particular embodiment, an input device 630 and a power supply 644 are coupled to the on-chip system 622. Moreover, in a particular embodiment, as illustrated in FIG. 6, the display 628, the input device 630, the speaker 636, the microphone 638, the wireless antenna 642, and the power supply 644 are external to the on-chip system 622. However, each can be coupled to a component of the on-chip system 622, such as an interface or a controller.

Figure 7:
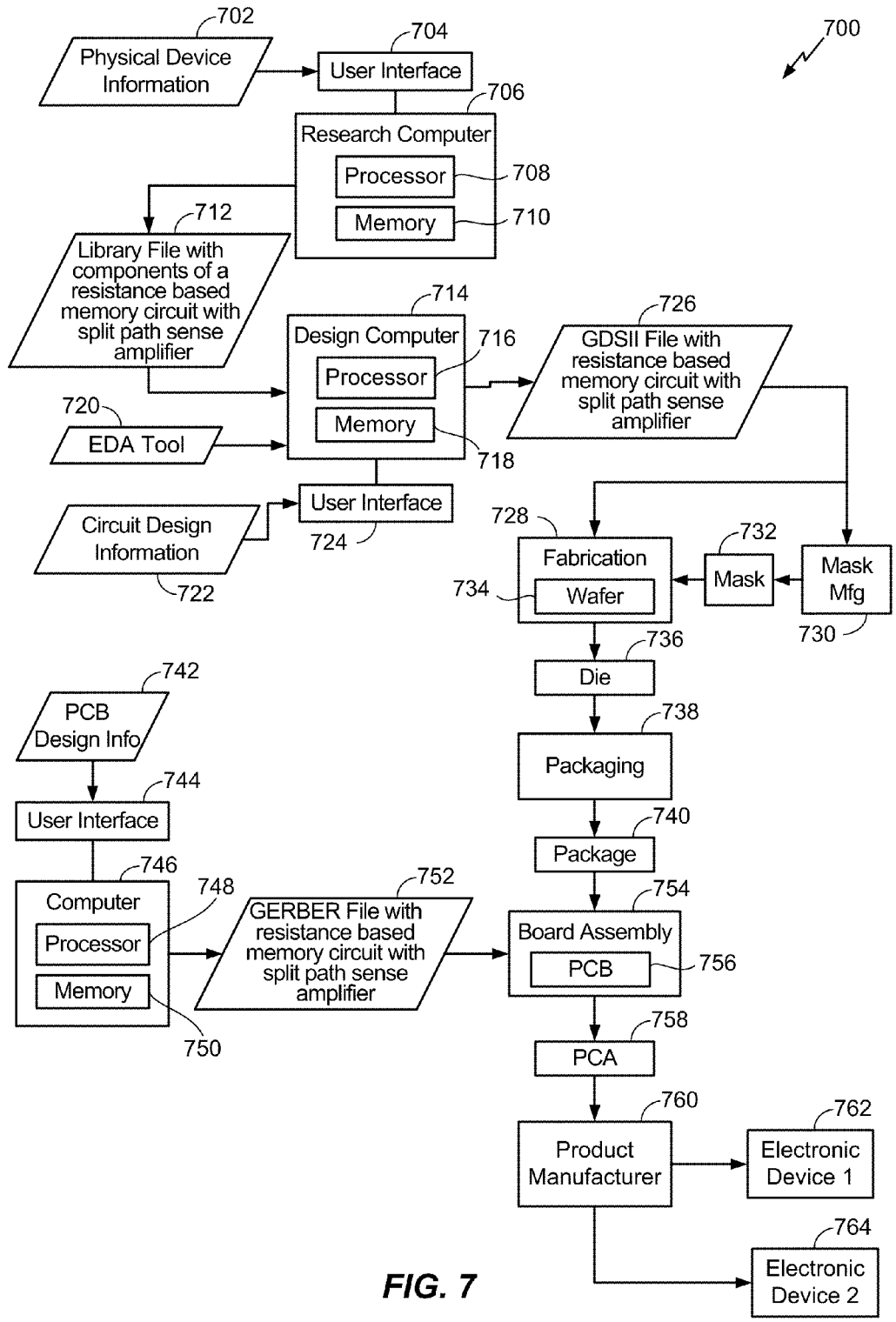
FIG. 7 is a data flow diagram of a particular illustrative embodiment of a manufacturing process to manufacture electronic devices that include a resistance based memory circuit including a split path sense amplifier.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 7 depicts a particular illustrative embodiment of an electronic device manufacturing process 700.

Physical device information 702 is received in the manufacturing process 700, such as at a research computer 706. The physical device information 702 may include design information representing at least one physical property of a resistance based memory circuit including a split path sense amplifier, such as the sensing circuit 100 of FIG. 1, the apparatus 200 of FIG. 2, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including the sensing circuit 100 of FIG. 1, the apparatus 200 of FIG. 2, or any combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including a resistance based memory circuit including a split path sense amplifier, such as the sensing circuit 100 of FIG. 1, the apparatus 200 of FIG. 2, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as the sensing circuit 100 of FIG. 1, the apparatus 200 of FIG. 2, or any combination thereof. To illustrate, the circuit design property may include identification of particular circuits and relationships to other elements in a circuit design, positioning information, feature size information, interconnection information, or other information representing a physical property of a semiconductor device. For example, the processor 716 may perform the method 300 of FIG. 3 to determine parameters such as transistor width of the load transistors 150, 152, 154, 156 of FIG. 1, the load transistors 250, 252, 254, 256, 251, 253, 255, 257 of FIG. 2, or any combination thereof.

The design computer 714 may be configured to transform the design information, including the circuit design information 722 to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the sensing circuit 100 of FIG. 1, the apparatus 200 of FIG. 2, or any combination thereof, in addition to other circuits or information. To illustrate, the data file may include information corresponding to a system-on-chip (SOC) that includes the SOC or system-in-package 622 of the electronic device 600 of FIG. 6 and that also includes additional electronic circuits and components within the SOC.

The GDSII file 726 may be received at a fabrication process 728 to manufacture the sensing circuit 100 of FIG. 1, the apparatus 200 of FIG. 2, the electronic device that includes a resistance based memory circuit including a split path sense amplifier of FIG. 6, or any combination thereof, according to transformed information in the GDSII file 726. For example, a device manufacture process may include providing the GDSII file 726 to a mask manufacturer 730 to create one or more masks, such as masks to be used for photolithography processing, illustrated as a representative mask 732. The mask 732 may be used during the fabrication process to generate one or more wafers 734, that may be tested and separated into dies, such as a representative die 736. The die 736 includes a circuit including the sensing circuit 100 of FIG. 1, the apparatus 200 of FIG. 2, the electronic device of FIG. 6, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the sensing circuit 100 of FIG. 1, the apparatus 200 of FIG. 2, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the device components to be used in the sensing circuit 100 of FIG. 1, the apparatus 200 of FIG. 2, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines for performing various steps of a PCB production process. The PCB 756 may be populated with electronic components including the package 740 to form a represented printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-7 may illustrate remote units according to the teachings of the disclosure, the disclosure is not limited to these exemplary illustrated units. Embodiments of the disclosure may be suitably employed in any device that includes active integrated circuitry including memory and on-chip circuitry for test and characterization.

Thus, the sensing circuit 100 of FIG. 1, the apparatus 200 of FIG. 2, the SOC or system-in-package 622 of the electronic device 600 that includes a resistance based memory circuit including a split path sense amplifier of FIG. 6, or any combination thereof, may be fabricated, processed, and incorporated into an electronic device, as described in the illustrative process 300. One or more aspects of the embodiments disclosed with respect to FIGS. 1-7 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity, or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a tangible storage medium such as random access memory (RAM), flash memory, read-only memory (ROM), programmable read-only memory (PROM), erasable programmable read-only memory (EPROM), electrically erasable programmable read-only memory (EEPROM), magnetoresistive random access memory (MRAM), phase-change random access memory (PRAM), or spin torque transfer MRAM (STT-MRAM), registers, hard disk, a removable disk, a compact disc read-only memory (CD-ROM), or any other form of storage medium known in the art. A tangible storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A sensing circuit comprising:
    a first path comprising a first resistive memory device; and
    a second path comprising a reference resistive memory device, wherein the first path is coupled to a first split path comprising a first load transistor and to a second split path comprising a second load transistor,
    wherein the second path is coupled to a third split path comprising a third load transistor and to a fourth split path comprising a fourth load transistor, and
    wherein at least one of a characteristic of the second load transistor and a characteristic of the third load transistor is adjusted to balance a first measured read margin and a second measured read margin.

2. The sensing circuit of claim 1, wherein the first path is a data path and the second path is a reference path.

3. The sensing circuit of claim 1, wherein the first split path comprises a first clamping transistor and the second split path comprises a second clamping transistor.

4. The sensing circuit of claim 3, wherein the third split path comprises a third clamping transistor and the fourth split path comprises a fourth clamping transistor.

5. The sensing circuit of claim 1, wherein the first load transistor is coupled to the fourth load transistor and wherein the second load transistor is coupled to the third load transistor.

6. The sensing circuit of claim 1, wherein the first load transistor, the second load transistor, the third load transistor, and the fourth load transistor are each PMOS type transistors.

7. The sensing circuit of claim 1, further comprising a sense amplifier responsive to the second load transistor and the fourth load transistor.

8. The sensing circuit of claim 7, wherein the sense amplifier compares an output of the second load transistor to an output of the fourth load transistor.

9. The sensing circuit of claim 1, wherein the first path comprises a first column selection transistor and the second path comprises a second column selection transistor.

10. The sensing circuit of claim 1, wherein the first resistive memory device is an element of a magnetoresistive random access memory (MRAM).

11. The sensing circuit of claim 1, wherein the first resistive memory device is a magnetic tunnel junction (MTJ) element of a spin transfer torque magnetoresistive random access memory (STT-MRAM).

12. The sensing circuit of claim 1, wherein the first path comprises a first access transistor and the second path comprises a second access transistor.

13. The sensing circuit of claim 1, wherein the characteristic of the second load transistor is a second load transistor width and the characteristic of the third load transistor is a third load transistor width.

14. The sensing circuit of claim 13, wherein the second load transistor width is greater than the third load transistor width.

15. The sensing circuit of claim 1, wherein the first read margin is a logic zero read margin and the second read margin is a logic one read margin.

16. The sensing circuit of claim 1, integrated in at least one semiconductor die.

17. The sensing circuit of claim 1, further comprising a device selected from the group consisting of a set top box, a music player, a video player, an entertainment unit, a navigation device, a communications device, a personal digital assistant (PDA), a fixed location data unit, and a computer, into which the sensing circuit is integrated.

18. An apparatus comprising:
    a memory comprising:
        a first memory cell comprising a first resistive memory device;
        a second memory cell comprising a second resistive memory device;
        a first bit line coupled to the first memory cell; and
        a second bit line coupled to the second memory cell,
        wherein the first bit line is coupled to a first set of split paths comprising load transistors, wherein a characteristic of at least one of the toad transistors is adjustable to balance a first measured read margin and a second measured read margin,
        wherein the second bit line is coupled to a second set of split paths, and
        wherein during a read operation the first bit line has a first current value when the first resistive memory device has a first logic state and a second current value when the first resistive memory device has a second logic state.

19. The apparatus of claim 18, wherein the characteristic is a transistor width.

20. The apparatus of claim 19, wherein the first logic state is a logic zero state and the second logic state is a logic one state.

21. The apparatus of claim 18, integrated in at least one semiconductor die.

22. The apparatus of claim 18, further comprising a device selected from the group consisting of a set top box, a music player, a video player, an entertainment unit, a navigation device, a communications device, a personal digital assistant (PDA), a fixed location data unit, and a computer, into which the memory is integrated.

23. A method of configuring a sense amplifier, the method comprising:
   directing current through a first path comprising a first resistive memory device;
   directing current through a second path comprising a reference resistive memory device,
   wherein the first path is coupled to a first split path and to a second split path, the first split path comprising a first load transistor and the second split path comprising a second load transistor, and
   wherein the second path is coupled to a third split path and to a fourth split path, the third split path comprising a third load transistor and the fourth split path comprising a fourth load transistor;
   measuring a first read margin of the first resistive memory device;
   measuring a second read margin of the first resistive memory device; and
   balancing the first read margin and the second read margin by adjusting at least one of a characteristic of first load transistor, a characteristic of the second load transistor, a characteristic of the third load transistor, and a characteristic of the fourth load transistor.

24. The method of claim 23, wherein the characteristic of the first load transistor is a first load transistor width, the characteristic of the second load transistor is a second load transistor width, the characteristic of the third load transistor is a third load transistor width, and the characteristic of the fourth load transistor is a fourth load transistor width.

25. The method of claim 23, wherein the first read margin is a logic zero read margin and the second read margin is a logic one read margin.

26. The method of claim 23, wherein each of the first resistive memory device and the reference resistive memory device comprises a magnetic tunnel junction (MTJ) device.

27. An apparatus comprising:
   a memory comprising:
      means for directing current through a first path comprising a first resistive memory device; and
      means for directing current through a second path comprising a reference resistive memory device,
      wherein the first path is coupled to a first split path and to a second split path, the first split path comprising a first load transistor and the second split path comprising a second load transistor,
      wherein the second path is coupled to a third split path and to a fourth split path, the third split path comprising a third load transistor and the fourth split path comprising a fourth load transistor, and
      wherein at least one of a characteristic of the second load transistor and a characteristic of the third load transistor is adjusted to balance a first measured read margin and a second measured read margin.

28. The apparatus of claim 27, integrated in at least one semiconductor die.

29. The apparatus of claim 27, further comprising a device selected from the group consisting of a set top box, a music player, a video player, an entertainment unit, a navigation device, a communications device, a personal digital assistant (PDA), a fixed location data unit, and a computer, into which the memory is integrated.

30. A method comprising:
   a first step for directing current through a first path comprising a first resistive memory device; and
   a second step for directing current through a second path comprising a reference resistive memory device,
   wherein the first path is coupled to a first split path and to a second split path, the first split path comprising a first load transistor and the second split path comprising a second load transistor,
   wherein the second path is coupled to a third split path and to a fourth split path, the third split path comprising a third load transistor and the fourth split path comprising a fourth load transistor, and
   wherein at least one of a characteristic of the second load transistor and a characteristic of the third load transistor is adjusted to balance a first measured read margin and a second measured read margin.

31. The method of claim 30, wherein the first step and the second step are performed by a processor integrated into an electronic device.

32. A computer readable tangible medium storing instructions executable by a processor, the instructions comprising instructions that are executable by the processor to:
   direct current through a first path comprising a first resistive memory device; and
   direct current through a second path comprising a reference resistive memory device,
   wherein the first path is coupled to a first split path and to a second split path, the first split path comprising a first load transistor and the second split path comprising a second load transistor,
   wherein the second path is coupled to a third split path and to a fourth split path, the third split path comprising a third load transistor and the fourth split path comprising a fourth load transistor, and
   wherein at least one of a characteristic of the second load transistor and a characteristic of the third load transistor is adjusted to balance a first measured read margin and a second measured read margin.

33. The computer readable tangible medium of claim 32, wherein the processor is integrated in a device selected from the group consisting of a set top box, a music player, a video player, an entertainment unit, a navigation device, a communications device, a personal digital assistant (PDA), a fixed location data unit, and a computer.

34. A method comprising:
   receiving design information representing at least one physical property of a semiconductor device, the semiconductor device comprising:
      a first path comprising a first resistive memory device; and
      a second path comprising a reference resistive memory device,
      wherein the first path is coupled to a first split path and to a second split path, the first split path comprising a first load transistor and the second split path comprising a second load transistor,
      wherein the second path is coupled to a third split path and to a fourth split path, the third split path comprising a third load transistor and the fourth split path comprising a fourth load transistor,
      wherein at least one of a characteristic of the second load transistor and a characteristic of the third load transistor is adjusted to balance a first measured read margin and a second measured read margin;
   transforming the design information to comply with a file format; and
   generating a data file comprising the transformed design information.

35. The method of claim 34, wherein the data file comprises a GDSII format.

36. A method comprising:
receiving a data file comprising design information corresponding to a semiconductor device; and
fabricating the semiconductor device according to the design information, wherein the semiconductor device comprises:
a first path comprising a first resistive memory device; and
a second path comprising a reference resistive memory device,
wherein the first path is coupled to a first split path and to a second split path, the first split path comprising a first load transistor and the second split path comprising a second load transistor,
wherein the second path is coupled to a third split path and to a fourth split path, the third split path comprising a third load transistor and the fourth split path comprising a fourth load transistor, and
wherein at least one of a characteristic of the second load transistor and a characteristic of the third load transistor is adjusted to balance a first measured read margin and a second measured read margin.

37. The method of claim 36, wherein the data file has a GDSII format.

38. A method comprising:
receiving design information comprising physical positioning information of a packaged semiconductor device on a circuit board, the packaged semiconductor device comprising a semiconductor memory comprising:
a first path comprising a first resistive memory device; and
a second path comprising a reference resistive memory device,
wherein the first path is coupled to a first split path and to a second split path, the first split path comprising a first load transistor and the second split path comprising a second load transistor,
wherein the second path is coupled to a third split path and to a fourth split path, the third split path comprising a third load transistor and the fourth split path comprising a fourth load transistor, and
wherein at least one of a characteristic of the second load transistor and a characteristic of the third load transistor is adjusted to balance a first measured read margin and a second measured read margin; and
transforming the design information to generate a data file.

39. The method of claim 38, wherein the data file has a GERBER format.

40. A method comprising:
receiving a data file comprising design information comprising physical positioning information of a packaged semiconductor device on a circuit board; and
manufacturing the circuit board configured to receive the packaged semiconductor device according to the design information, wherein the packaged semiconductor device comprises a structure comprising:
a first path comprising a first resistive memory device, and
a second path comprising a reference resistive memory device,
wherein the first path is coupled to a first split path and to a second split path, the first split path comprising a first load transistor and the second split path comprising a second load transistor,
wherein the second path is coupled to a third split path and to a fourth split path, the third split path comprising a third load transistor and the fourth split path comprising a fourth load transistor, and
wherein at least one of a characteristic of the second load transistor and a characteristic of the third load transistor is adjusted to balance a first measured read margin and a second measured read margin.

41. The method of claim 40, wherein the data file has a GERBER format.

42. The method of claim 40, further comprising integrating the circuit board into a device selected front the group consisting of a set top box, a music player, a video player, an entertainment unit, a navigation device, a communications device, a personal digital assistant (PDA), a fixed location data unit, and a computer.

* * * * *

UNITED STATES PATENT AND TRADEMARK OFFICE
CERTIFICATE OF CORRECTION

PATENT NO. : 8,154,903 B2
APPLICATION NO. : 12/486089
DATED : April 10, 2012
INVENTOR(S) : Seong-Ook Jung, Jisu Kim and Seung H. Kang Page 1 of 1

It is certified that error appears in the above-identified patent and that said Letters Patent is hereby corrected as shown below:

Title Page, Item [73], After the first assignee, add the following:

Industry-Academic Cooperation Foundation, Yonsei University, Seoul, Korea (KR)

To be listed as follows:

[73] Assignees: QUALCOMM Incorporated, San Diego, CA (US)
Industry-Academic Cooperation Foundation, Yonsei University, Seoul, Korea (KR)

Signed and Sealed this
Eighth Day of October, 2013

Teresa Stanek Rea
*Deputy Director of the United States Patent and Trademark Office*